United States Patent
Kawagoshi et al.

(10) Patent No.: US 6,518,804 B2
(45) Date of Patent: Feb. 11, 2003

(54) SEMICONDUCTOR INTEGRATED CIRCUIT DEVICE

(75) Inventors: Hirokazu Kawagoshi, Shiga (JP); Hiroyuki Kitajima, Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/092,169

(22) Filed: Mar. 6, 2002

(65) Prior Publication Data

US 2002/0125922 A1 Sep. 12, 2002

(30) Foreign Application Priority Data

Mar. 7, 2001 (JP) ........................................ 2001-062893

(51) Int. Cl.[7] ................................................. H03B 1/00
(52) U.S. Cl. ........................ 327/112; 327/170; 327/374; 327/376
(58) Field of Search ........................ 327/108–112, 333, 327/427, 434, 170, 374, 376, 377; 326/33, 83, 81

(56) References Cited

U.S. PATENT DOCUMENTS 5,742,193 A * 4/1998 Colli et al. .................. 327/170
6,262,607 B1 * 7/2001 Suzuki ........................ 327/112

FOREIGN PATENT DOCUMENTS

JP 4-259115 9/1992

* cited by examiner

*Primary Examiner*—Terry D. Cunningham
*Assistant Examiner*—Long Nguyen
(74) *Attorney, Agent, or Firm*—Choate, Hall & Stewart

(57) ABSTRACT

A semiconductor integrated circuit device with a high switching speed of an internal power source voltage supplied via an operational amplifier, when said internal power source voltage is output from a switching circuit, is provided. As input signal Vin goes from "L" level to "H" level, MOSFET 21 in switching circuit 20 turns on. At this point, upon the rising edge of input signal Vin to the "H" level, a one shot pulse is supplied to the gate of MOSFET 31 from one-shot-pulse generating circuit 32, and MOSFET 31 turns on. As MOSFET 31 turns on, electric potential at the gate of MOSFET 14, which is included in operational amplifier 13, becomes "L" level, MOSFET 14 turns on completely flowing electric current quickly from external power source voltage $V_{cc}$ to a capacitive load via MOSFET 14 and MOSFET 21, and output voltage Vout of switching circuit 20 climb up with a steeply-rising waveform.

11 Claims, 5 Drawing Sheets

SEMICONDUCTOR INTEGRATED CIRCUIT DEVICE

BACKGROUND OF THE INVENTION

1. Field of the Invention

The present invention relates to a semiconductor device, which includes a driver circuit for driving a capacitive load based on an input signal, and an power supply transistor for supplying a power supply voltage to said driver circuit. In particular, it relates to a semiconductor device such as a driver circuit for a common terminal of a liquid crystal display device, where the output signal amplitude of said driver circuit needs to be adjusted based on the power source voltage.

2. Description of the Prior Art

An example of a conventional semiconductor integrated circuit device of this type is described below while referencing FIG. 8. FIG. 8 is a semiconductor integrated circuit device for driving a common terminal of a liquid crystal display device used in, for example, mobile telephones. In FIG. 8, 100 denotes to a semiconductor integrated circuit device, wherein external power source $V_{CC}$ is connected to power source terminal 1, ground terminal 2 is connected to ground, input signal Vin is supplied to input terminal 3, and capacitive load CL is connected to output terminal 4. Semiconductor integrated circuit device 100 includes internal power source circuit 10, which generates a desired internal power source voltage $V_{HL}$ from external power source voltage $V_{CC}$, and switching circuit 20, which performs switching control in conformity with input signal Vin outputting internal power source voltage $V_{HL}$ to output terminal 4.

Internal power source circuit 10 is configured such that external power source voltage $V_{CC}$ is divided into a desired voltage level at the connection point of resistor 11 and resistor 12, which are connected in series, and is output as internal power source voltage $V_{HL}$ to switching circuit 20 via operational amplifier 13. As shown by the specific structural example illustrated in FIG. 9, operational amplifier 13 is configured such that it has P-channel MOSFET 14 and N-channel MOSFET 15, which are connected in series, at the output stage; the source of MOSFET 14 is connected to power source terminal 1; the source of MOSFET 15 is connected to ground terminal 2; and internal power source voltage $V_{HL}$ is output from the junction of MOSFET 14 and MOSFET 15.

Switching circuit 20 is configured such that it has a CMOS structure comprising P-channel MOSFET 21 and N-channel MOSFET 22, wherein internal power source voltage $V_{HL}$ is supplied to the source of MOSFET 21 and ground terminal 2 is connected to the source of MOSFET 22. With this structure, when input signal Vin, which is from input terminal 3, is supplied to the respective gates of MOSFET 21 and MOSFET 22 via inverter 23, MOSFET 21 and MOSFET 22 are on/off controlled to output internal power source voltage $V_{HL}$ from the junction of MOSFET 21 and MOSFET 22 to output terminal 4 as output voltage Vout.

As for the operation of semiconductor integrated circuit device 100 having the above-mentioned structure, once external power source voltage $V_{CC}$ is supplied to power source terminal 1, external power source voltage $V_{CC}$ is divided into a desired voltage level at the junction of resistor 11 and resistor 12, and the resulting voltage is output from internal power supply circuit 10 as internal power supply voltage $V_{HL}$ via operational amplifier 13. While in the state where internal power supply voltage $V_{HL}$ is being output from internal power supply circuit 10, as input signal Vin goes from a "L=0" level to a "H=$V_{CC}$" level and MOSFET 21 of switching circuit 20 turns on, as shown in FIG. 10, electrical current flows from internal power source 10 via MOSFET 21 to capacitive load CL, which is connected to output terminal 4, and output voltage Vout climbs up to internal power source voltage $V_{HL}$.

In the semiconductor integrated circuit device described above, while output voltage Vout climbs up to input power source voltage $V_{HL}$, the electric potential at the gate of MOSFET 21 is at level "L", and MOSFET 21 is turned on completely. On the other hand, while operational amplifier 13 of internal power source circuit 10 is in the state where external.power source voltage $V_{CC}$ is divided at the junction of resistor 11 and resistor 12 thereby being supplied to the non-inverting input terminal, since the electric potential at the gate of MOSFET 14 does not reach level "L=0", even though MOSFET 14 may be on, it is not turned on completely. At this point, for example, if the size of MOSFET 14 is designed to be the same size as MOSFET 21, although MOSFET 21 may be turned on completely, since MOSFET 14 is not turned on completely, the electric current capacity of MOSFET 14 is insufficient when compared to the electric current capacity of MOSFET 21. In this case, the operating speed of operational amplifier 13 in response to changes in electric current is slow and cannot keep up with high-speed electric current changes occurring during switching. Accordingly, as shown in FIG. 10, there is a problem, wherein after internal power source voltage $V_{HL}$ has temporarily fallen, since the rising waveform up to the desired voltage has a gentle slope, the rising waveform of the output voltage Vout has also a gentle slope.

When a semiconductor integrated circuit device is used as a driver of liquid crystal display device, the desired display cannot be achieved. In order to speed up the operational speed in response to electric current changes in operational amplifier 13, a larger size of output transistor 14 included in operational amplifier 13 may be used; however, there is a problem with the semiconductor integrated circuit device having a larger chip size.

SUMMARY OF THE INVENTION

The present invention has come about in consideration of the problems described above and aims to provide a semiconductor integrated circuit device in which switching speed is increased by increasing electric current capacity of an internal power source circuit the instant a switching circuit is switched on.

A semiconductor integrated circuit device according to the present invention, comprises:

a driver circuit driving a capacitive load responding to an input signal;

a power source transistor biased so as to supply a fixed voltage to a power supply terminal of said drive circuit; and a control circuit detecting a change in said input signal, forcibly shifting bias of said power source transistor and increasing an electrical current supply capacity of said power source transistor when said input signal changes to drive said capacitive load with electric current supplied from said power source transistor.

These and other objects of the present invention will be apparent to those of skill in the art from the appended claims when read in light of the following specification and accompanying figures.

DETAILED DESCRIPTION OF THE INVENTION

Figure 1:
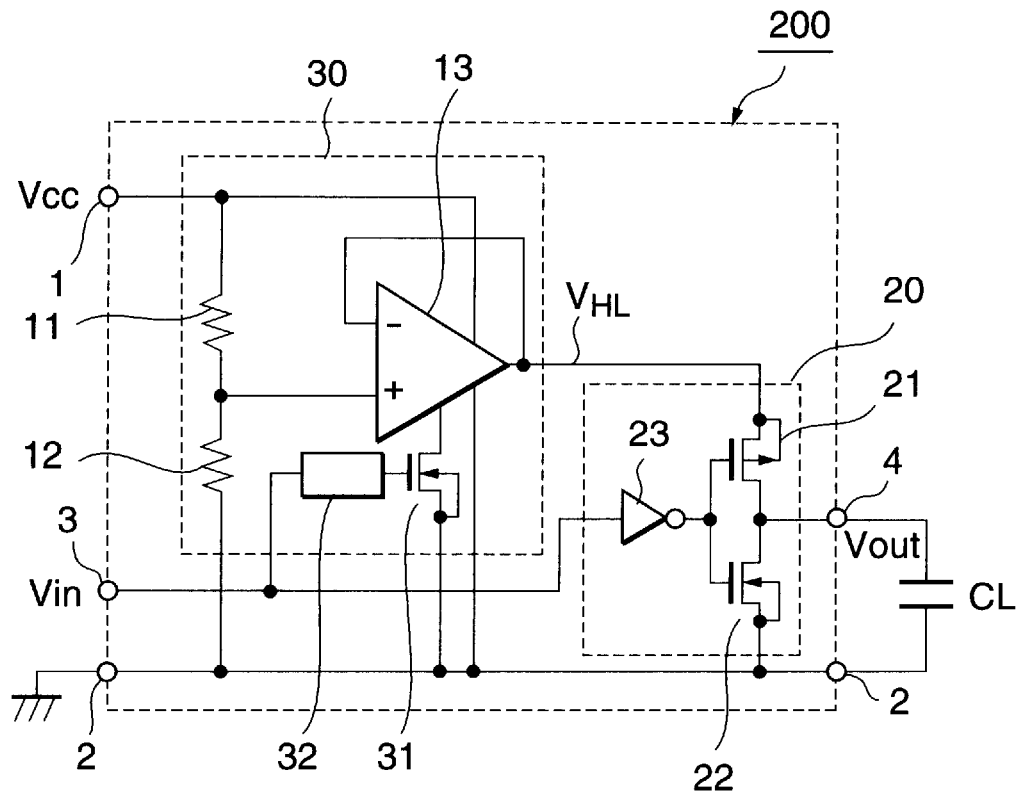
FIG. 1 is a block diagram of a semiconductor integrated circuit device according to a first embodiment of the present invention.

The first embodiment of the present invention is described forthwith while referencing FIG. 1. It is noted that items equivalent to those in FIG. 8 are assigned the same reference numerals and the respective descriptions thereof are omitted.

In FIG. 1, 200 denotes a semiconductor integrated circuit device, where external power source $V_{CC}$ is connected to power source terminal 1, ground terminal 2 is connected to ground, input signal Vin is supplied to input terminal 3, and capacitive load CL is connected to output terminal 4. Semiconductor integrated circuit device 200 includes internal power source circuit 30, which generates a desired internal power source voltage $V_{HL}$ from external power source voltage $V_{CC}$, and switching circuit 20, which performs switching control in conformity with input signal Vin outputting internal power source voltage $V_{HL}$ to output terminal 4 and has the same configuration as that in FIG. 8.

Figure 8:
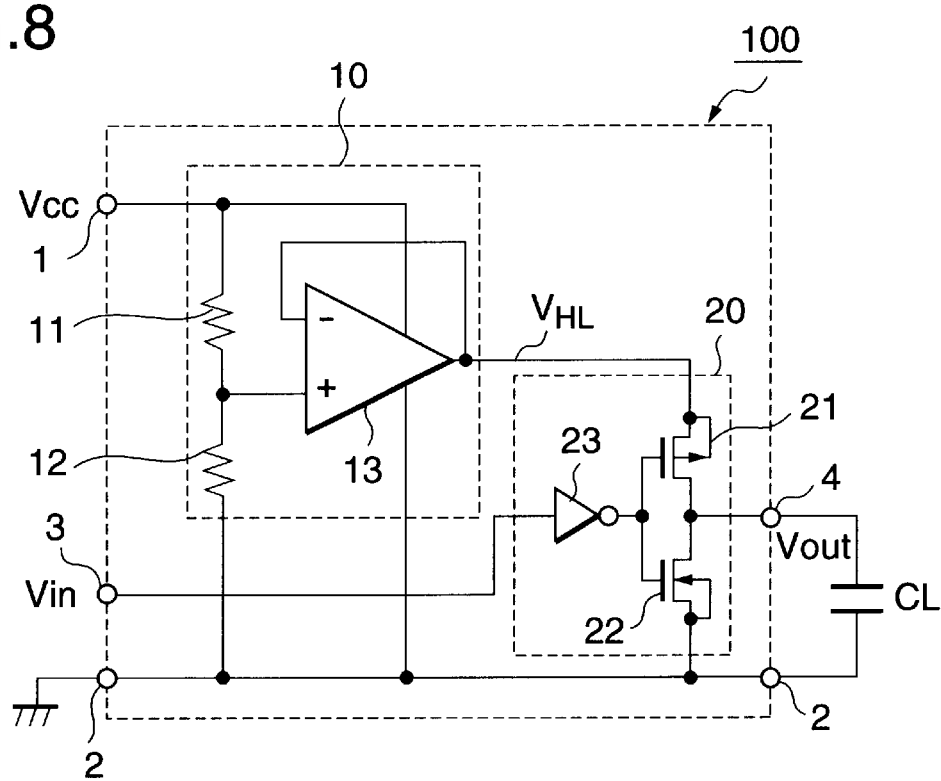
FIG. 8 is a block diagram of a conventional semiconductor integrated circuit device.
Figure 9:
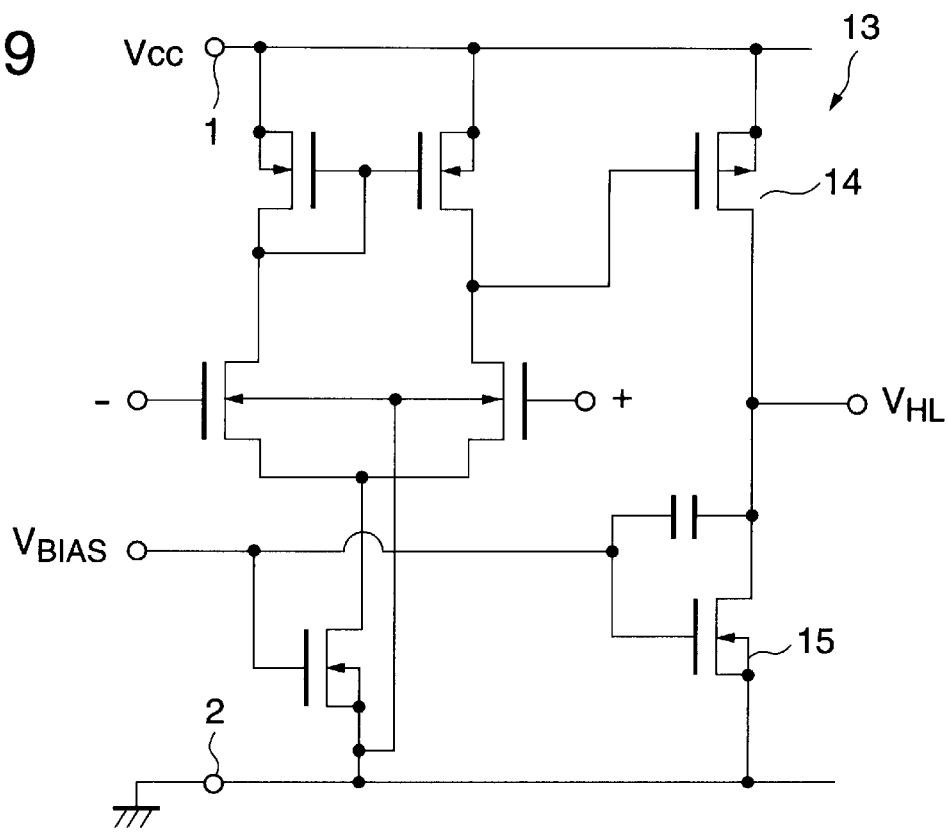
FIG. 9 is a circuit diagram of an example of an operational amplifier used in the internal power source circuit of the semiconductor integrated circuit device shown in FIG. 1 and FIG. 8.
Figure 10:
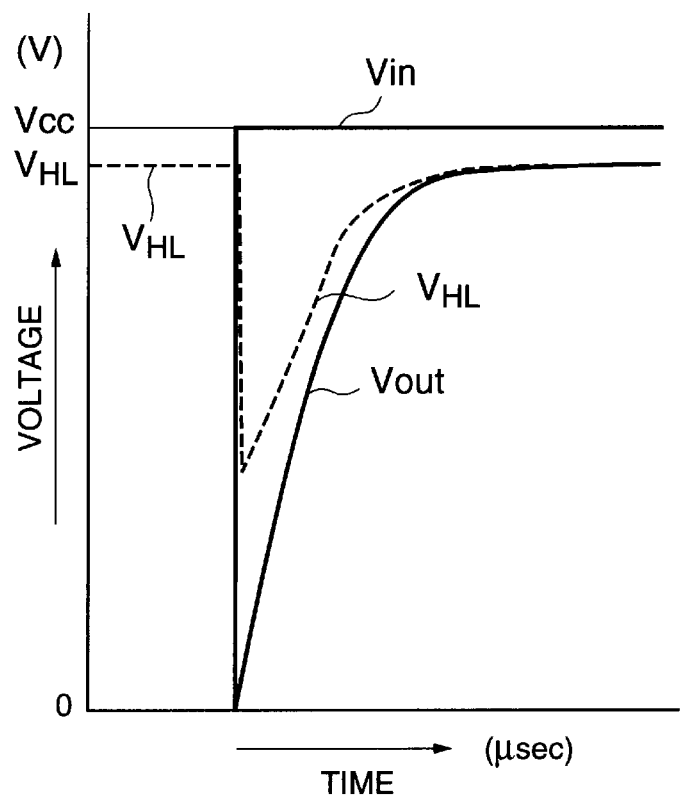
FIG. 10 is a timing chart for describing operation of the semiconductor integrated circuit device in FIG. 8.

Internal power source circuit 30, as with internal power source circuit 10 in FIG. 8, is configured such that external power source voltage $V_{CC}$ is divided into a desired voltage level at the junction of resistor 11 and resistor 12, which are connected in series, and output to switching circuit 20 via operational amplifier 13 as internal power source voltage $V_{HL}$; however, besides this it includes the following configuration, which is the highlight of the present invention. It includes N-channel MOSFET 31, which increase the electric current capacity of internal power source circuit 30 by turning it on, and one-shot-pulse generating circuit 32, which causes MOSFET 31 to turn on with a one shot pulse that is output upon the leading edge of input signal Vin up to "H" level.

Figure 2:
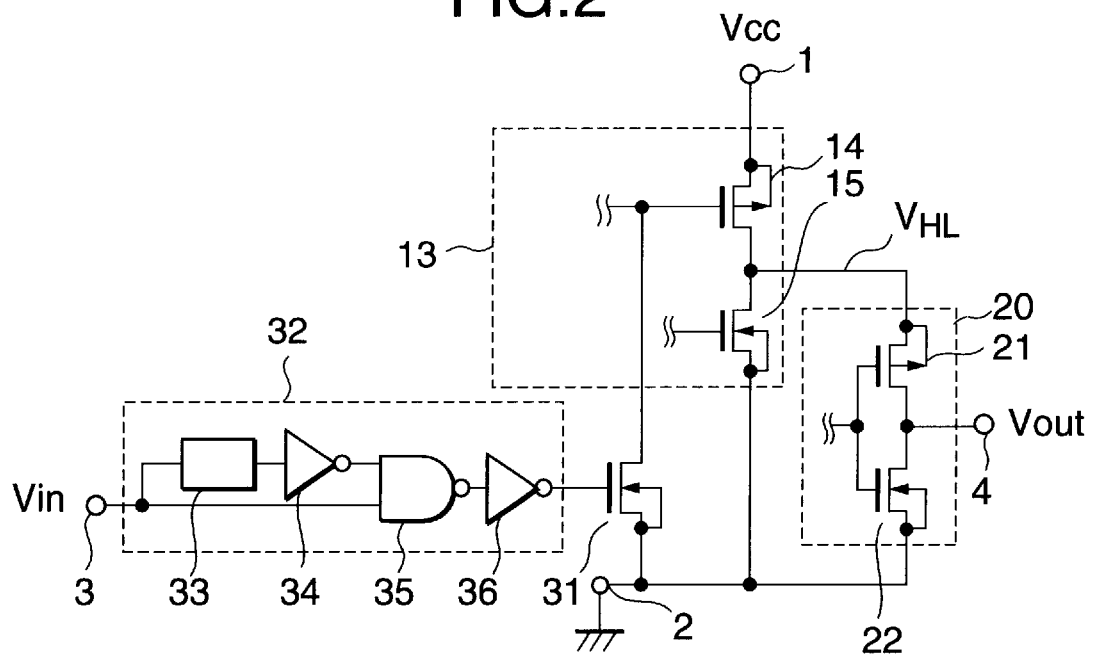
FIG. 2 is a circuit diagram of an internal power source circuit of the semiconductor integrated circuit device shown in FIG. 1.

The drain of MOSFET 31, as shown in FIG. 2, is connected to the gate of P-channel MOSFET 14, which configures the high voltage drive stage in the output stage of operational amplifier 13. The source of MOSFET 31 is connected to ground terminal 2. As shown in FIG. 2, one-shot-pulse generating circuit 32 is configured from delay circuit 33, inverter 34, two-input NAND circuit 35, and inverter 36. Input signal Vin is supplied to one of the two input terminals of two-input NAND circuit 35 and the input terminal of delay circuit 33. The output of delay circuit 33 is supplied to the other of the two input terminals of two-input NAND circuit 35 via inverter 34. The output of two-input NAND circuit 35 is supplied to the gate of MOSFET 31 as the output of one-shot-pulse generating circuit 32 via inverter 36. It is noted that this type of one-shot-pulse generating circuit itself, which detects a change in input signal and generates a one shot pulse is well known and is, for example, mentioned in Japanese Patent Application Laid-open No. Hei 4-259115.

Figure 3:
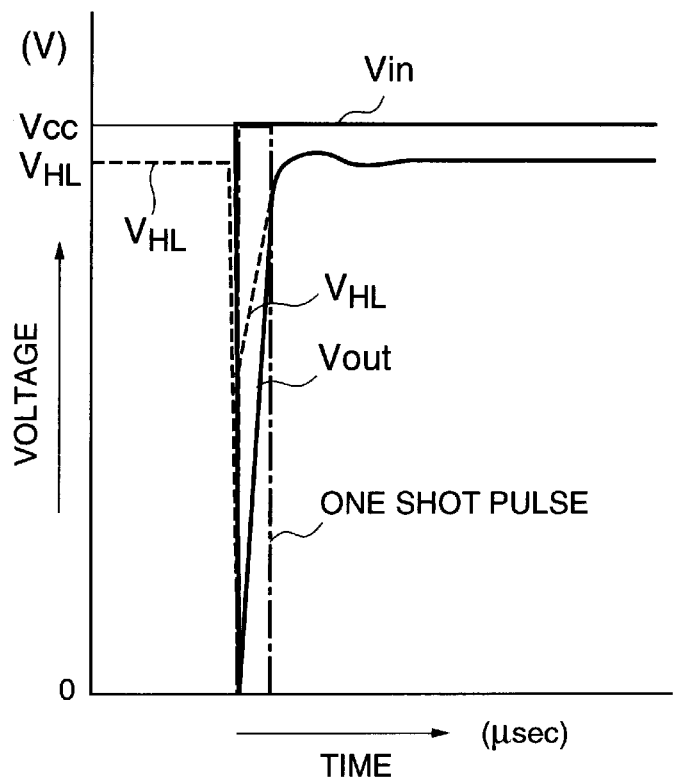
FIG. 3 is a waveform graph for describing operation of the semiconductor integrated circuit device shown in FIG. 1.

As for the operation of semiconductor integrated circuit device 200 having the above-mentioned structure, as external power source voltage $V_{CC}$ is supplied to electric current terminal 1, external power source voltage $V_{CC}$ is divided into a desired voltage level at the junction of resistor 11 and resistor 12 and the resulting voltage is output from internal power supply circuit 30 as internal power supply voltage $V_{HL}$ via operational amplifier 13. While in the state where internal power source voltage $V_{HL}$ is being output from internal power source circuit 30, as input signal Vin goes from "L" level to "H" level, as shown in FIG. 3, MOSFET 21 of switching circuit 20 turns on. At this point, upon the rising edge of input signal Vin to the "H" level, a one shot pulse is supplied to the gate of MOSFET 31 from one-shot-pulse generating circuit 32 in internal power source circuit 30, and MOSFET 31 turns on. As MOSFET 31 turns on, electric potential at the gate of MOSFET 14, which is included in operational amplifier 13 of internal power source circuit 30, becomes "L" level, MOSFET 14 turns on completely to flow electric current quickly from external power source voltage $V_{CC}$ to a capacitive load via MOSFET 14 and MOSFET 21, and internal power source voltage $V_{HL}$ from internal power source circuit 30 and output voltage Vout from switching circuit 20 climb up with a steeply-rising waveform. After output voltage Vout has sufficiently climbed up, a one shot pulse climbs back down, and MOSFET 31 turns off.

As described above, since MOSFET 31 is turned on and MOSFET 14, which is included in operational amplifier 13, is turned on completely, due to the one shot pulse from one-shot-pulse generating circuit 32, which climbs up upon the rising edge of input signal Vin, electric current capacity of operational amplifier 13 is increased only during the period of the one shot pulse and the slant of the rising waveform of output signal Vout from output terminal 4 becomes steep.

It is desirable that the pulse width of the one shot pulse output by one-shot-pulse generating circuit 32 be a pulse width allowing the one shot pulse to turn off immediately before Vout reaches the voltage level of $V_{HL}$. For example, in the case of a narrow pulse which turns off just as or before the one shot pulse climbs up to Vout, the advantageous effect of the present invention of speeding up the ascent of Vout cannot be achieved; alternatively, in the case where the width of the one shot pulse is too wide, output voltage Vout exceeds the desired voltage $V_{HL}$ and is held at a voltage near $V_{CC}$ until the one shot pulse falls, which is not desirable. Therefore, delay circuit 33, which has a delay time such that the one shot pulse may have the desired pulse width, can be used. If the variation in the delay time of delay circuit 33 or the drive capacity of P-channel MOSFET 14 and switching circuit 20 is considered, it is desirable that the pulse width of the one shot pulse be a pulse width such that an active level (high level) is maintained until Vout is at least ½ the voltage of $V_{HL}$, and after input signal Vin has climbed up, climbs down within a span of time twice that necessary for Vout to reach the voltage of $V_{HL}$.

Figure 4:
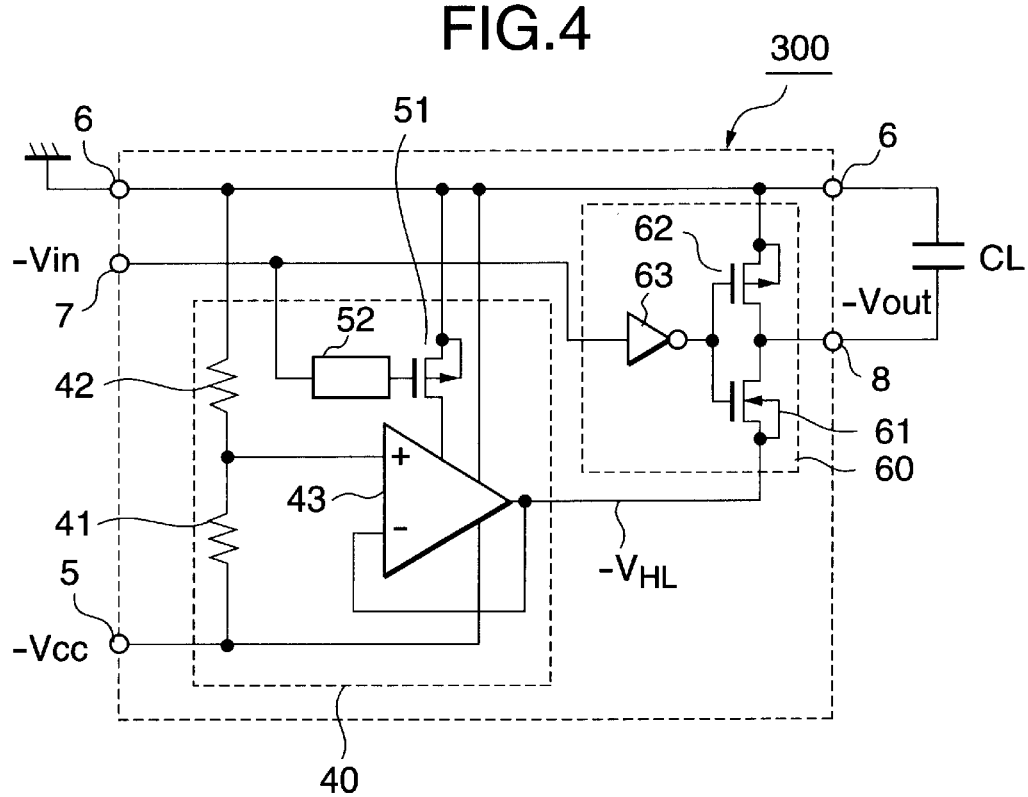
FIG. 4 is a block diagram of a semiconductor integrated circuit device according to a second embodiment of the present invention.

Next, the second embodiment of the present invention is described forthwith while referencing FIG. 4. In FIG. 4, 300 denotes a semiconductor integrated circuit device where external power source $-V_{CC}$ is connected to power source terminal 5, ground terminal 6 is connected to ground, input signal -Vin is supplied to input terminal 7, and capacitive load CL is connected to output terminal 8. Semiconductor integrated circuit device 300 includes internal power source circuit 40, which generates a desired internal power source voltage $-V_{HL}$ from an external power source voltage $-V_{CC}$, and switching circuit 60, which provides switching control in conformity with input signal -Vin outputting internal power source voltage $-V_{HL}$ to output terminal. 8.

Figure 5:
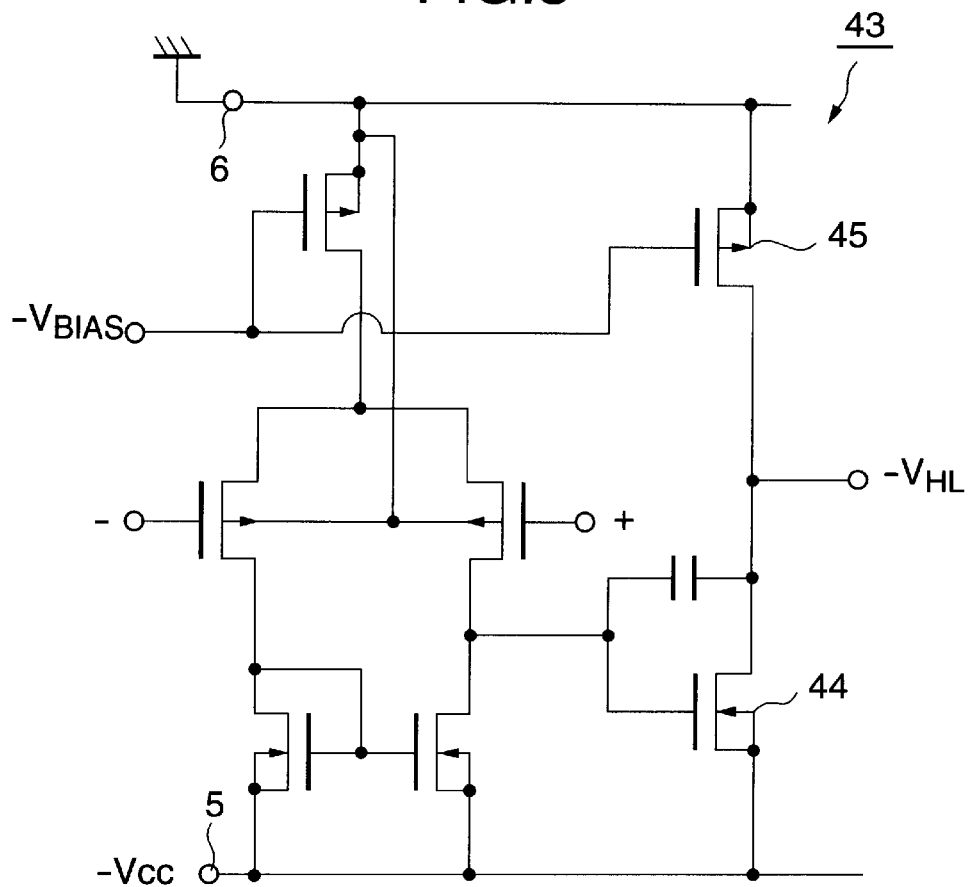
FIG. 5 is a circuit diagram of an example of an operational amplifier used in the internal power source circuit of the semiconductor integrated circuit device shown in FIG. 4.

As with internal power source circuit 30 as shown in FIG. 1, internal power source circuit 40 includes resistor 41, resistor 42, operational amplifier 43, P-channel MOSFET 51, and one-shot-pulse generating circuit 52. As shown by the specific structural example illustrated in FIG. 5, operational amplifier 43 is configured such that it has N-channel MOSFET 44 and P-channel MOSFET 45, which are connected in series, in the output stage; the source of MOSFET 44 is connected to power source terminal 5; the source of MOSFET 45 is connected to ground terminal 6; and internal power source voltage $-V_{HL}$ is output from the connection point of MOSFET 44 and MOSFET 45.

Figure 6:
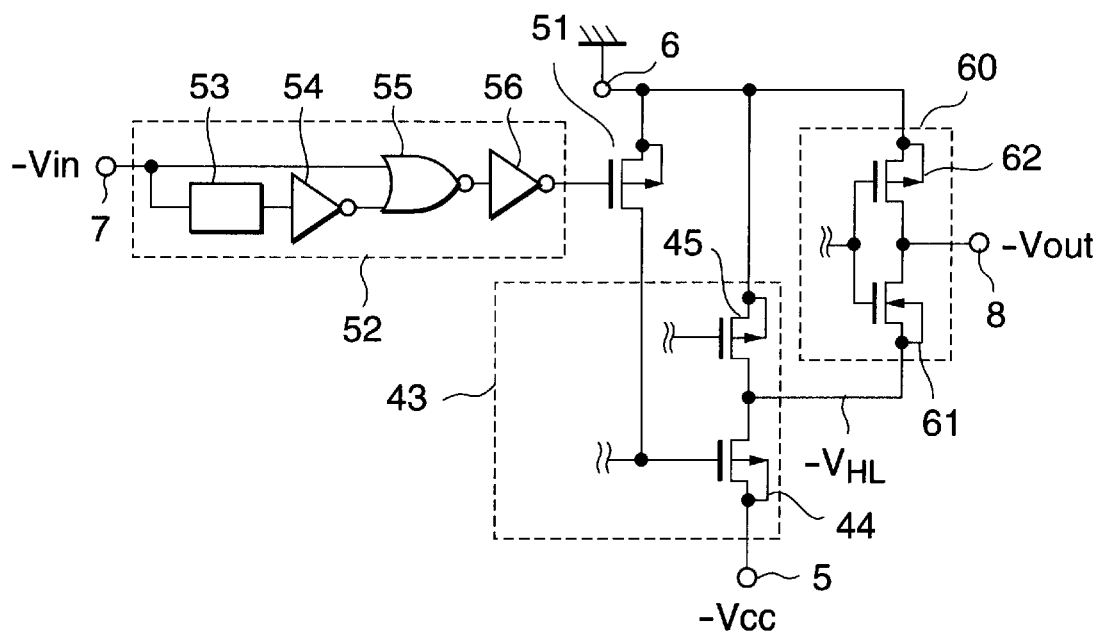
FIG. 6 is a circuit diagram of a main part of an internal power source circuit of the semiconductor integrated circuit device shown in FIG. 4.

The drain of MOSFET 51, as shown in FIG. 6, is connected to the gate of N-channel MOSFET 44, which configures the low voltage drive stage in the output stage of operational amplifier 43. The source of MOSFET 51 is connected to ground terminal 6. As shown in FIG. 6, one-shot-pulse generating circuit 52 is configured from delay circuit 53, inverter 54, two-input NOR circuit 55, and inverter 56. Input signal -Vin is supplied to one of the two input terminals of two-input NOR circuit 55 and the input terminal of delay circuit 53. Output of delay circuit 53 is supplied to the other of the two input terminals of two-input NOR circuit 55 via inverter 54. The output of two-input NOR circuit 55 is supplied to the gate of MOSFET 51 as the output of one-shot-pulse generating circuit 52 via inverter 56.

As with switching circuit 20 shown in FIG. 8, switching circuit 60 has a CMOS structure comprising N-channel MOSFET 61 and P-channel MOSFET 62. The source of MOSFET 61 is connected to internal power source voltage $-V_{HL}$; the source of MOSFET 62 is connected to ground terminal 6. When input signal -Vin is supplied from input terminal 7 to the respective gates of MOSFET 61 and MOSFET 62 via inverter 63, MOSFET 61 and MOSFET 62 are on/off controlled to output internal power source voltage $-V_{HL}$ to output terminal 8 as output voltage -Vout from the junction of MOSFET 61 and MOSFET 62.

Figure 7:
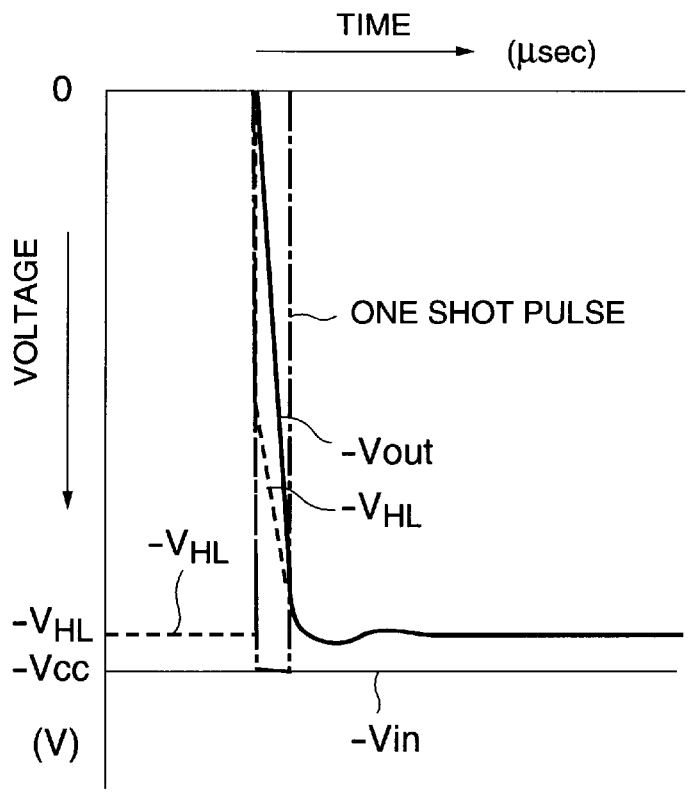
FIG. 7 is a waveform graph for describing operation of the semiconductor integrated circuit device shown in FIG. 4.

As for the operation of semiconductor integrated circuit device 300 having the above-mentioned structure, external power source voltage $-V_{CC}$ is supplied to power source terminal 5, external power source voltage $-V_{CC}$ is divided into a desired voltage level at the junction of resistor 41 and resistor 42, and the resulting voltage is output from internal power supply circuit 40 as internal power supply voltage $-V_{HL}$ via operational amplifier 43. While in the state where internal power source voltage $-V_{HL}$ is being output from internal power source circuit 40, as input signal -Vin goes from "H=0" level to "L=,$-V_{CC}$" level, as shown in FIG. 7, MOSFET 61 of switching circuit 60 turns on. At this point, a one shot pulse is supplied from one-shot-pulse generating circuit 52 of internal power source circuit 40 upon the falling edge of input signal -Vin to the "L" level, and MOSFET 51 turns on. As MOSFET 51 turns on, electric potential at the gate of MOSFET 44, which is included in operational amplifier 43 of internal power source circuit 40, becomes "H" level; MOSFET 44 turns on completely flowing electric current quickly from external power source $-V_{CC}$ to a capacitive load via MOSFET 44 and MOSFET 61; and internal power source voltage $-V_{HL}$ from internal power source circuit 40 and output voltage -Vout from switching circuit 60 climb down with a steeply-falling waveform.

As described above, since MOSFET 51 is turned on and MOSFET 44 included in operational amplifier 43 is turned on completely due to the one shot pulse from one-shot-pulse generating circuit 52, which climbs down upon the falling edge of input signal -Vin, electric current capacity of operational amplifier 43 is increased only during the period of the one shot pulse, and the slant of the falling waveform of output signal -Vout from output terminal 8 becomes steep.

As described above, with the semiconductor integrated circuit device according to the present invention, without having a larger size of output transistor included in an operational amplifier, it is possible to speed up the switching speed of a semiconductor integrated circuit device without having a large sized circuit for the internal power source circuit.

While preferred embodiments of the present invention have been described, it is to be understood that the invention is to be defined by the appended claims when read in light of the specification and when accorded their full range of equivalent.

What is claimed is:

1. A semiconductor integrated circuit device comprising:
    a driver circuit driving a capacitive load responding to an input signal;
    a power source transistor biased so as to supply a fixed voltage to a power supply terminal of said drive circuit; and
    a control circuit detecting a change in said input signal, forcibly shifting bias of said power source transistor and increasing an electrical current supply capacity of said power source transistor when said input signal changes to drive said capacitive load with electric current supplied from said power source transistor.

2. The semiconductor device of claim 1, wherein said control circuit includes a pulse circuit detecting a change in said input signal and generating a one shot pulse; and forcibly shifts bias of said power source transistor while said one shot pulse is being output.

3. The semiconductor device of claim 1, further comprising:
    a differential circuit which comprises a non-inverting input terminal connected to a bias voltage source, and an inverting input terminal connected to the output of said power source transistor, and which provides a bias voltage to said power source transistor for equalizing output voltage of said power source transistor with voltage of said bias voltage source.

4. The semiconductor device of claim 1, further comprising;
    a bias circuit connected to a gate electrode of said power source transistor and providing a gate bias to said power source transistor;

wherein said control circuit comprises:

a pulse circuit detecting a change in said input signal and outputting a one shot pulse, said change making said driver circuit to drive said capacitive load with electric current supplied from said power source transistor; and a switch circuit receiving said one shot pulse and coupling said gate electrode with a second power source other than said power source.

5. The semiconductor device of claim 4, wherein said one shot pulse output by said pulse circuit maintains an active state until said driver circuit charges said capacitive load to a voltage at least ½ of said fixed voltage; and-becomes inactive after twice the length of time needed to charge to said fixed voltage.

6. A semiconductor device comprising:

a driver circuit driving a capacitive load based on an input signal;

a power source transistor supplying power source voltage to said driver circuit;

a bias circuit controlling a gate voltage of said power source transistor;

a pulse circuit detecting a change in said input signal, and outputting a one shot pulse, said change making said driver circuit to drive said capacitive load with electric current supplied from said power source transistor; and a switch circuit receiving said one shot pulse and coupling said gate electrode to a second power source other than said power source.

7. The semiconductor device of claim 6, wherein said bias circuit comprises a differential circuit, said differential circuit comprising a non-inverting input terminal connected to a bias power supply, an inverting input terminal connected to the drain of said power supply transistor, and an output terminal connected to said gate voltage.

8. The semiconductor device of claim 6, wherein said switch circuit comprises a MOS transistor, said MOS transistor comprising a gate electrode connected to the output terminal of said pulse circuit, a source electrode connected to said second power supply, and a drain electrode connected to a gate electrode of said power source transistor.

9. The semiconductor device of claim 6, wherein said pulse circuit outputs a one shot pulse synchronous to either one of the rising edge or falling edge of said input signal.

10. A semiconductor integrated circuit device, which generates internal power source voltage by supplying external power source voltage to an internal power source circuit; supplies to a switching circuit the internal power source voltage from an output transistor included in an operational amplifier configuring the internal power supply circuit; and supplies the internal power source voltage to a capacitive load by performing switching control in conformity with an input signal;

said semiconductor integrated circuit device comprising a pulse circuit generating a one shot pulse synchronous with said input signal; and raising the drive capacity of said output transistor during the period of said one shot pulse.

11. The semiconductor integrated circuit device of claim 10, wherein the electric potential of a control terminal of said output transistor is made to be an electric potential capable of turning said output transistor completely on in conformity with said one shot pulse.

* * * * *